United States Patent [19]

Irrinki et al.

[11] Patent Number: 5,956,350
[45] Date of Patent: Sep. 21, 1999

[54] BUILT IN SELF REPAIR FOR DRAMS USING ON-CHIP TEMPERATURE SENSING AND HEATING

[75] Inventors: V. Swamy Irrinki, Milpitas; Yervant D. Lepejian, Palo Alto, both of Calif.

[73] Assignees: LSI Logic Corporation; Heuristic Physics Laboratories, Inc., both of Milpitas, Calif.

[21] Appl. No.: 08/958,775

[22] Filed: Oct. 27, 1997

[51] Int. Cl.⁶ ....................................................... G06F 11/00
[52] U.S. Cl. ............................................................ 371/21.1
[58] Field of Search ............................... 371/21.1, 21.2, 371/21.4, 21.6, 22.1, 22.5, 28; 365/201; 395/183.18

[56] References Cited

U.S. PATENT DOCUMENTS

| | | |
|---|---|---|
| 4,057,788 | 11/1977 | Sage . |
| 4,633,438 | 12/1986 | Kume et al. . |
| 4,661,929 | 4/1987 | Aoki et al. . |
| 4,715,014 | 12/1987 | Tuvell et al. . |
| 4,910,709 | 3/1990 | Dhong et al. . |
| 4,935,896 | 6/1990 | Matsumura et al. . |
| 5,021,999 | 6/1991 | Kohda et al. . |
| 5,119,330 | 6/1992 | Tanagawa . |
| 5,159,570 | 10/1992 | Mitchell et al. . |
| 5,172,338 | 12/1992 | Mehrotra et al. . |
| 5,276,843 | 1/1994 | Tillinghast et al. . |
| 5,278,796 | 1/1994 | Tillinghast et al. . |
| 5,282,162 | 1/1994 | Ochii . |
| 5,283,761 | 2/1994 | Gillingham . |
| 5,351,210 | 9/1994 | Saito . |
| 5,357,464 | 10/1994 | Shukuri et al. . |
| 5,394,362 | 2/1995 | Banks . |
| 5,459,686 | 10/1995 | Saito . |
| 5,471,209 | 11/1995 | Sutterlin et al. . |
| 5,521,865 | 5/1996 | Ohuchi et al. . |
| 5,532,955 | 7/1996 | Gillingham . |
| 5,577,050 | 11/1996 | Bair et al. . |
| 5,596,534 | 1/1997 | Manning . |
| 5,600,591 | 2/1997 | Takagi . |
| 5,652,729 | 7/1997 | Iwata et al. . |
| 5,673,028 | 9/1997 | Levy ........................................ 340/635 |
| 5,684,997 | 11/1997 | Kau et al. ................................ 395/773 |

OTHER PUBLICATIONS

Bakker, et al, "micropower CMOS Temperature Sensor with Digital Output," IEEE Journal of solid–State Circuits, vol. 31, No. 7, Jul. 1996, pp. 933–937.

Abbott, et al., "A 4K MOS Dynamic Random–Access Memory," IEEE Journal of Solid–State Circuits, vol. SC–8, No. 5, Oct. 1973, pp. 292–298.

*Primary Examiner*—Vincent P. Canney
*Attorney, Agent, or Firm*—Conley, Rose & Tayon, PC; B. Noel Kivlin

[57] ABSTRACT

A memory device which tests the memory array under typical operating conditions. In one embodiment, the memory device incorporates a heating element to heat the memory array to a predetermined operating temperature, and a BIST (built-in self test) unit to test the memory array at the predetermined operating temperature. This may advantageously provide a method for detecting and repairing faulty memory locations that would not normally test faulty under initial power-up conditions. Broadly speaking, the present invention contemplates a memory device which comprises a memory array and a heating element on a substrate. The memory array is configured to receive a read/write signal on a read/write line, configured to receive an address on an address bus, configured to provide data to a data bus when the read/write signal indicates a read operation, and configured to store data from the data bus when the read/write signal indicates a write operation. The data on the data bus is stored in a memory location indicated by the address on the address bus. The heating element is coupled to the substrate to heat the memory array to a predetermined operating temperature. The memory device may further include a temperature sensor coupled to the substrate and configured to provide a temperature signal indicative of a temperature of the memory array, and a heating control coupled to receive the temperature signal and coupled to responsively regulate power to the heating element.

18 Claims, 3 Drawing Sheets

BUILT IN SELF REPAIR FOR DRAMS USING ON-CHIP TEMPERATURE SENSING AND HEATING

BACKGROUND OF THE INVENTION

1. Field of the Invention

This invention relates to the field of digital electronic memory devices, and in particular to a method for testing and repairing these devices in the field.

2. Description of the Related Art

It is common practice for the manufacturers of memory chips to test the functionality of the memories at the manufacturing site. After the chips have been tested and certified for shipment upon sale to the users, the users generally depend upon the reliability of the chips for their own system to function properly. As the density and line width of memory cells within a memory array circuit chip continue to shrink (now at less than half a micron), this reliability becomes more difficult to achieve. One of the challenges for the manufacturers of memory devices, is to increase memory capacity without decreasing chip yields due to malfunctioning parts.

Before the memory chips are released for shipment, they typically undergo testing to verify that each of the memory cells within the memory array is functioning properly. This testing method is routinely done because it is not uncommon for a large percentage of the memory cells within the chip to fail, either because of manufacturing defects or degradation faults.

In the past, chip memories have been tested using an external memory tester or Automatic Test Equipment (ATE) at the manufacturing site. This testing technique is not available to users once the chips have been shipped, making it difficult to detect faulty memory cells at the user site. Even if test equipment is available to users, field repairs are expensive, time-consuming, and impractical.

In addition, some repairs of ASIC memories have also been performed at the manufacturing site. Conventional repairing techniques bypass the defective cells using fuseable links that cause address redirection. However, these techniques require significant capital investment for implementing the technical complexity of the repairing process, and moreover, fail to address the possibility of failure after shipment from the manufacturing facility.

Because of the complexity of field repairs, some memory chips have been equipped with built-in self test (BIST) and built-in self repair (BISR) circuitry. As used herein, the term "BIST" refers to the actual test, while "BIST unit" and "BIST circuitry" refer to the circuitry that performs BIST. Similarly, "BISR" refers to the process of built-in self repair, while "BISR unit" and "BIST circuitry" refer to the circuitry that performs BISR. BIST operates by reading and writing various patterns to the memory at chip power-up, thus determining faulty memory cells. If failing cells are present, the BISR circuitry reassigns the row or column containing the failing cell to a spare row or column in the memory array. Because BIST and BISR are performed each time power is applied to the system, latent failures that occur between subsequent system power-ups may be detected in the field.

Since BIST and BISR are conducted at the operating conditions that exist at the time the system containing the memory device is powered on, they may not identify memory cells that are susceptible to failure at degraded conditions. For example, the refresh interval of a dynamic memory cell is a strong function of temperature, such that the necessary refresh interval of the cell decreases as the temperature increases. While BIST and BISR may perform a refresh interval test at power-up, the temperature of the system at that time may not be sufficient to induce a failure. Subsequently, however, the temperature of the system may increase to a point that one or more memory cells will fail. Since BIST and BISR have already been performed at system power-on, BISR does not redirect accesses to these cells, which may result in a catastrophic system error.

It would therefore be desirable to have a test method which identifies and disables memory locations that are susceptible to failure under normal operating conditions, while still maintaining the ability to detect and repair failures dynamically at the customer site.

SUMMARY OF THE INVENTION

The problems outlined above are in large part solved by a memory device which tests the memory array under typical operating conditions. In one embodiment, the memory device incorporates a heating element to heat the memory array to a predetermined operating temperature, and a BIST (built-in self test) unit to test the memory array at the predetermined operating temperature. This may advantageously provide a method for detecting and repairing faulty memory locations that would not normally test faulty under initial power-up conditions.

Broadly speaking, the present invention contemplates a memory device which comprises a memory array and a heating element on a substrate. The memory array is configured to a receive a read/write signal on a read/write line, configured to receive an address on an address bus, configured to provide data to a data bus when the read/write signal indicates a read operation, and configured to store data from the data bus when the read/write signal indicates a write operation. The data on the data bus is stored in a memory location indicated by the address on the address bus. The heating element is coupled to the substrate to heat the memory array to a predetermined operating temperature. The memory device may further include a temperature sensor coupled to the substrate and configured to provide a temperature signal indicative of a temperature of the memory array, and a heating control coupled to receive the temperature signal and coupled to responsively regulate power to the heating element.

The present invention further contemplates a method for on-chip testing and repairing of memories in a system that contains a heating element, a test circuit, a repair circuit, a memory array, and a plurality of redundant memory locations within the memory array. The method comprises the steps of: (i) heating the memory array to a predetermined operating temperature; (ii) testing the memory array; (iii) determining an original address of a faulty location in the memory array; and (iv) repairing the faulty location by using the repair circuit to redirect the original address to an address of a redundant memory location.

The present invention further contemplates an on-chip system for detecting and repairing data retention faults under normal operating conditions. The system comprises a memory array, a plurality of redundant memory cells, a heating element, a testing unit, and a repair module. The memory array includes a plurality of memory cells, and the plurality of redundant memory cells is coupled to the memory array to replace faulty memory cells. The heating element is coupled to the memory array for heating the memory array to a predetermined operating temperature, while the testing unit is coupled to the memory array for testing the memory array and determining an original address of a faulty memory cell. Finally, the repair module is coupled to the memory array and the testing unit for repairing the faulty memory cell with a redundant memory cell by redirecting the original address to an address of the redundant memory cell.

BRIEF DESCRIPTION OF THE DRAWINGS

Other objects and advantages of the invention will become apparent upon reading the following detailed description and upon reference to the accompanying drawings in which.

Figure 1:
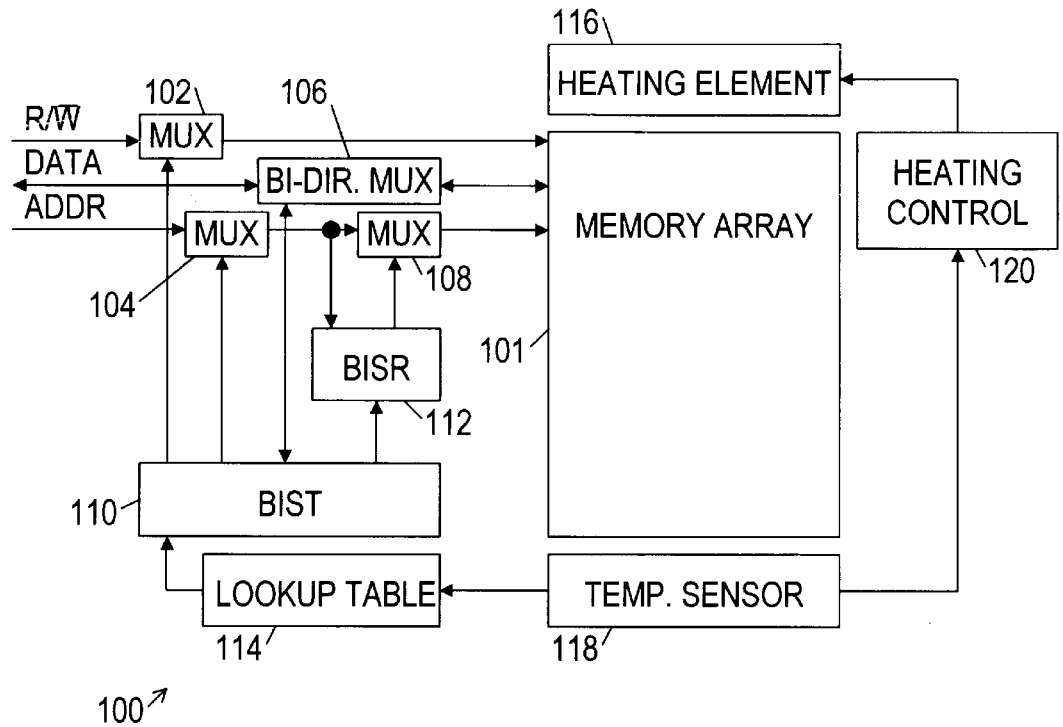
FIG. 1 depicts a block diagram of one embodiment of a memory storage device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, there is shown a block diagram of one embodiment of a memory storage device 100 capable of built-in self test and repair using on-chip temperature sensing and heating. The memory storage device 100 includes a memory array 101, multiplexers 102, 104, 106 and 108, a built-in self test (BIST) unit 110, a built-in self repair (BISR) module 112, and a refresh interval lookup table 114. The memory storage device further includes a heating element 116, a temperature sensor 118, and a heating control module 120.

Memory storage device 100 incorporates BIST and BISR functionality, and advantageously performs the BIST and BISR functions under conditions which closely approximate the operating conditions of device 100. This allows for detection and correction of errors which might not occur at the power-up conditions of the device, but which nevertheless may cause failures under normal operating conditions. The heating element 116 is engaged at power-up to bring the memory array 101 to a temperature that approximates the normal operating temperature. A temperature sensor 118 detects the temperature of the memory array 101 and provides a signal to the heating control module 120 which regulates the operation of the heating element 116. An output from the temperature sensor 118 is used to select an entry from the refresh interval lookup table 114, and the entry is provided to BIST unit 110 so that the BIST unit can verify the operation of the memory array at the specified refresh interval.

The memory array 101 receives an address signal (ADDR) and a read/write signal (R/W), and either receives or provides a data signal. If the read/write signal indicates a write operation, memory array 101 stores the data represented by the data signal in a memory location indicated by the address signal. If the read/write signal indicates a read operation, memory array 101 detects the data stored in the memory location indicated by the address signal and drives the data signal on the data lines. The multiplexers 102, 104, 106, and 108 provide for steering and re-direction of the address, data, and read/write signals.

BIST unit 110 controls multiplexers 102, 104 and 106. When the BIST unit is active, multiplexers 102 and 104 forward the read/write and address signals, respectively, from the BIST unit 110 to memory array 101. For test write operations, multiplexer 106 forwards test data from the BIST unit 110 to memory array 101. For test read operations, multiplexer 106 directs data from memory array 101 to the BIST unit 110. Multiplexer 108 is controlled by the BISR module 112. As explained further below, when the BISR module 112 detects an address to a faulty memory location, it maps the address to the address of a redundant memory location. The multiplexer 108 is then used to select the uncorrected address when no fault location is recognized by the BISR module 112, and to select the re-mapped address when the BISR module 112 detects an address to a faulty memory location.

Generally speaking, BIST and BISR can be employed in a memory storage device 100 to provide improved test coverage for faulty memory cells. In one embodiment, BIST unit 110 cycles memory array 101 through various test patterns upon power-up. Every time a failing row or column is detected, this information is conveyed to BISR unit 112, which attempts to reassign accesses to the failing location to a redundant row or column within the memory array. BISR unit 112 monitors all incoming addresses to determine if any match one of the failing addresses detected by the BIST unit 110. If a match is found, BISR unit 112 provides a corrected address via multiplexer 108 so that the reassigned memory location is accessed instead of the location originally addressed. This combination of BIST and BISR testing each cell in the memory array and redirecting addresses is performed on each application of power to the memory chip.

As described above, BIST and BISR only detect memory locations that are failing at power-up, and not those that may occur after a given time (e.g., temperature-related fails that may occur after the system heats up). Hence a provision is made to delay the execution of the BIST and BISR until after the memory array has reached normal operating conditions. Heating element 116, temperature sensor 118, and heating control 120 operate to reduce this delay.

The heating element 116 may take many forms, as the heat may be generated by power dissipation of nearly any large circuit element. For example, passing a large current through a resistive line on the surface or a highly doped channel in the substrate will generate heat. The heating element can be configured in a ring around the memory array for fast, distributed heating of the array.

Since temperature affects many electrical characteristics such as resistance, leakage currents, and characteristic voltages, the temperature sensor 118 can also be implemented in many forms. An example of one suitable temperature sensor is described by Anton Bakker and Johan H. Huijsing in "Micropower CMOS Temperature Sensor with Digital Output," IEEE Journal of Solid-State Circuits, vol. 31, no. 7, July 1996, which is hereby incorporated by reference. More than one sensor may be used, and the temperature sensors should be placed to determine both a maximum temperature (near the heating element) and an average temperature (near the array center) for the memory array.

In one embodiment, heating control 120 is configured to regulate the current to the heating element to avoid current spikes to the rest of the chip. Heating control 120 initiates the heating process at power-on, and discontinues the heating process once the temperature sensors 118 indicate that the desired temperature has been reached. An example for a range of desired temperatures includes 70° C.–85° C. In another embodiment, a specified time interval is allowed for heating, and once the interval has elapsed, testing occurs at the resulting temperature.

In one embodiment, memory array 101 is a DRAM cell array having cells which are subject to leakage currents and hence cells which must be refreshed periodically. The leakage currents are highly sensitive to temperature, so that cells which are prone to retention faults may pass muster at power-up conditions. A refresh interval lookup table 114 is triggered by the temperature sensor 118 to provide a maximum refresh delay to the BIST unit 110. The BIST unit 110 then uses the specified (temperature-dependent) maximum refresh delay to test for retention faults in the memory array 101.

Figure 2:
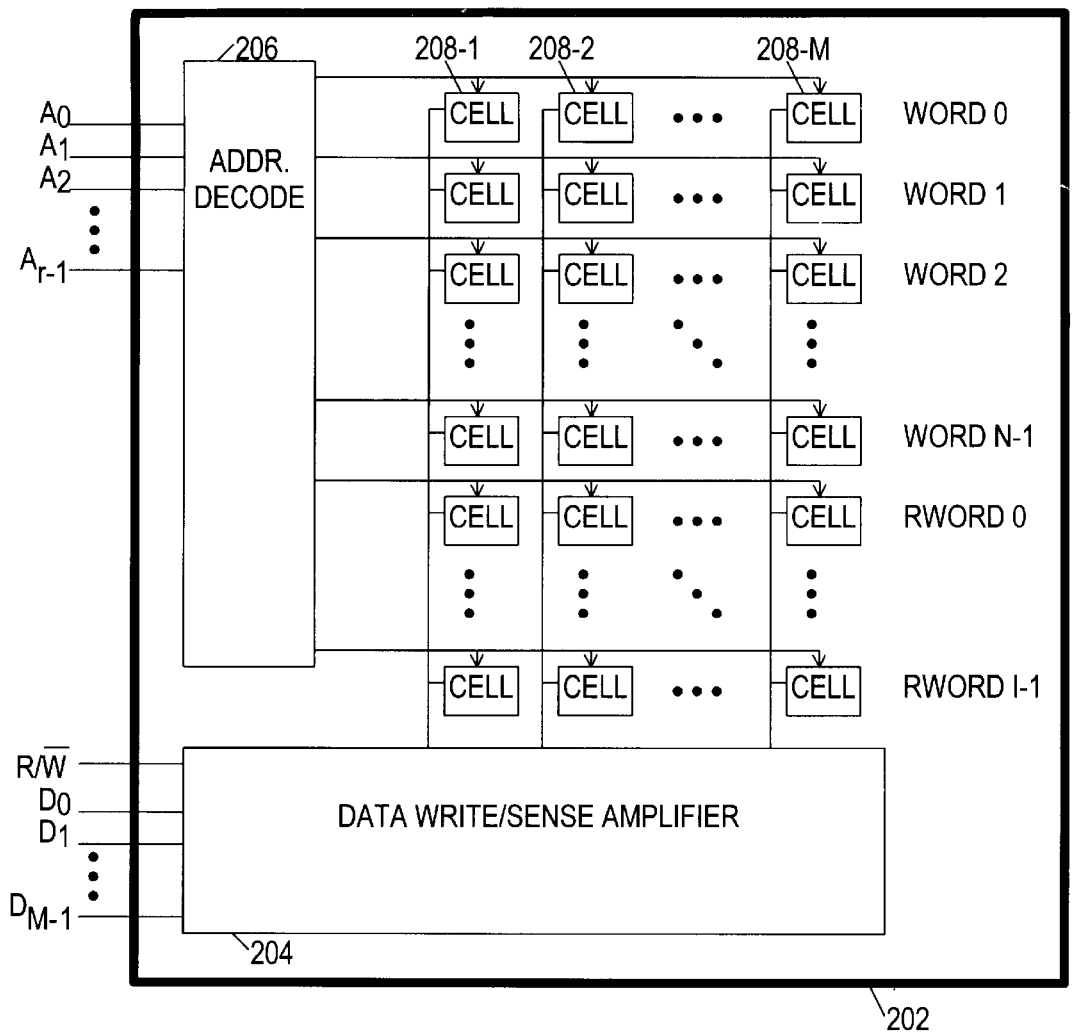
FIG. 2 depicts a block diagram of one embodiment of a memory array.

Referring now to FIG. 2, a block diagram of one embodiment of the memory array 101 is shown. The memory array 101 includes a ground plane 202, a data write/sense amplifier 204, an address decoder 206, and a plurality of memory cells 208-1 through 208-M. The ground plane 202 is a conductive path held at a constant voltage to shield the signal lines within the memory array from electrical noise. The data write/sense amplifier 204 senses data stored in a row of memory cells during a read operation and drives the detected data on data lines $D_0$ through $D_{M-1}$. The data write/sense amplifier 204 retrieves data from data lines $D_0$ through $D_{M-1}$ and stores the data in a row of memory cells during a write operation. The type of operation being performed by the data write/sense amplifier is controlled by the read/write line. Each row of memory cells is referred to as a word. The row of memory cells being read from or written to is determined by the address decoder 206 which receives an address on lines $A_0$ through $A_{r-1}$ and responsively asserts a word line. The row of cells coupled to the asserted word line can then be accessed for read or write operations. The memory array 101 includes a set of redundant words which can be used in place of faulty words. When a faulty word is detected, subsequent accesses to the address of the faulty word can be redirected to one of the redundant words.

Figure 3:
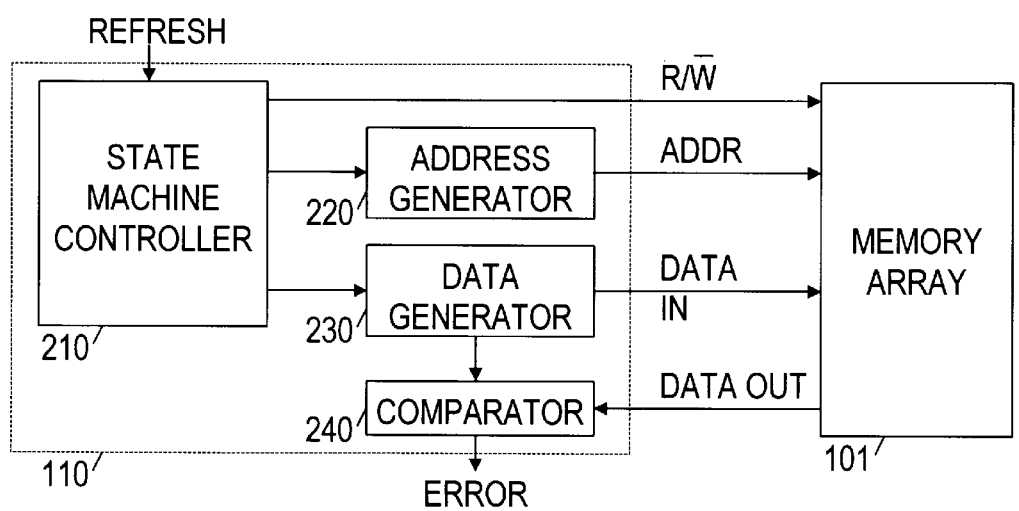
FIG. 3 depicts a block diagram of one embodiment of built-in self test and control circuitry within a memory storage device.

Referring now to FIG. 3, a functional block diagram of the BIST unit 110 is shown in greater detail. Circuit portions corresponding to those of FIG. 1 are numbered identically. Portions of BIST unit 110 depicted in FIG. 3 include a state machine controller 210, a BIST address generator 220, a BIST data generator 230, and a comparator 240. State machine controller 210 drives a BIST read/write signal to memory array 101, as well as inputs to BIST address generator 220 and BIST data generator 230. BIST address generator 220 drives a BIST address to memory array 101, while BIST data generator 230 drives a BIST data in signal to memory array 101. The BIST data in signal is also provided to comparator 240, which also receives a data out signal from memory array 101. The output of comparator 240, an error signal, is conveyed to BISR unit 112, where it is processed as described further below. The BIST address signal and BIST read/write signals include control signals for operating multiplexers 102, 104, and 106.

BIST unit 110 is connected to memory array 101 to transfer test patterns to detect column faults, row faults, bridging faults, "stuck-at" faults, and retention faults in memory array 101. Column and row faults are caused by defective bit lines and defective word lines, respectively. A bridging fault indicates a cell is shorted to an adjoining cell, and stuck-at faults indicate a particular cell is "stuck" at a certain value. Data retention faults indicate the cell has failed the refresh interval specification. As discussed further below, BISR module 112 is connected to memory array 101 to repair faults detected by BIST unit 110. The BIST unit 110 transfers detected fault addresses to BISR module 112 to enable BISR module 112 to repair the faults.

State machine controller 210, address generator 220, and data generator 230 operate to generate patterns for detecting column faults, row faults, bridging faults, "stuck-at" faults, and retention faults. These elements produce a data pattern that provides optimal fault coverage in identifying the faulty memory cells. In one embodiment, memory faults are detected by performing separate tests, namely a column lines test, a row lines test, a bridging test, a data storage test, and a data retention test.

When power is applied to memory storage device 100, a heating process is initiated, then the BIST unit 110 begins a test algorithm to verify the operation of memory array 101. In one embodiment of memory storage device 100, BIST unit 110 is simply a state machine that is programmed to cycle through various test patterns. BIST address generator 220 generates addresses in an order specified by the test algorithm. In one embodiment, address generator 220 may simply be a counter circuit that is initialized to point to the first address in memory array 101, and subsequently cycles through all available address locations in response to appropriate input signals from state machine controller 210. Additionally, state machine controller 210 drives the BIST read/write signal to select either a read or write operation to memory array 101 as defined by the test algorithm. BIST data generator 230 generates a data value as the BIST data in signal in response to control signals from state machine controller 210. This value is conveyed to memory array 101 during a write cycle. On a read cycle, this value is conveyed as the BIST data in signal to the comparator 240, which also receives the output of memory array 101 as the data out signal. Comparator 240 then compares the values on the BIST data in signal and the data out signal, asserting the error signal if a mismatch is detected. This error signal, which indicates the failing address, is conveyed to BISR unit 112.

After BIST unit 120 has completed testing, state machine controller 210 becomes inactive, and the multiplexers 102, 104, and 106 are set to select the external read/write, address, and data signal lines. At this point, memory storage device 100 can now satisfy requests for memory array 101 from the external pins.

Figure 4:
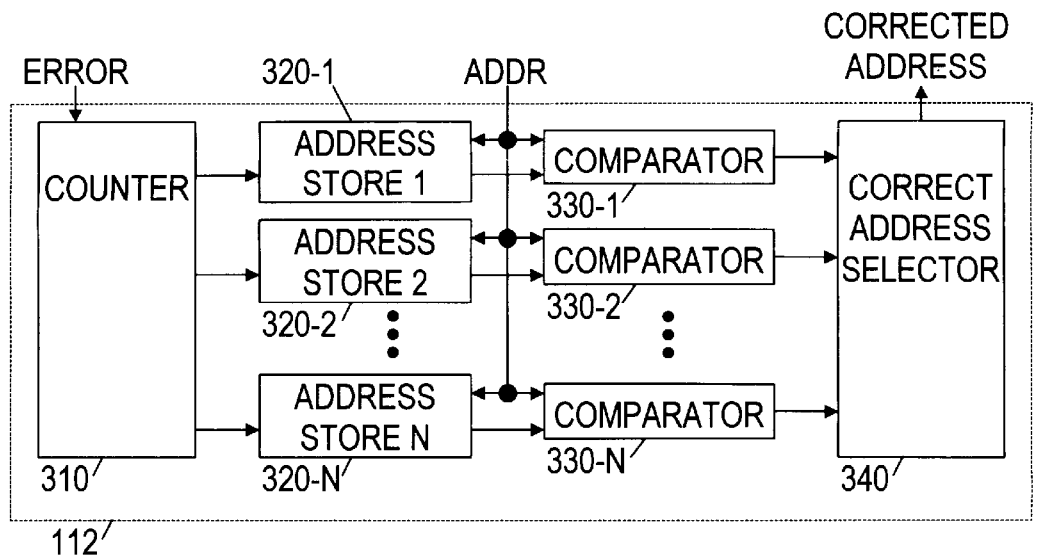
FIG. 4 depicts a block diagram of one embodiment of built-in self repair circuitry within a memory storage device.

Referring now to FIG. 4, a block diagram of one embodiment of BISR module 112 is shown. As illustrated, BISR module 112 comprises a counter 310, a plurality of address store units 320-1 through 320-N, a group of comparators 330-1 though 330-N, and an address selector 340. When an error is detected by the BIST unit 110, counter 310 sends a latch signal to one of the address stores 320, then increments. The address stores 320 are coupled to receive the uncorrected address signal at the input of multiplexer 108, and to store the uncorrected address when a corresponding latch signal is asserted. In this manner, a plurality of faulty addresses can be stored by BISR module 112. After one or more addresses have been stored, subsequent uncorrected addresses are compared by the comparators 330 to the stored addresses. A match to one of the stored addresses causes the corresponding comparator to trigger the address selector 340 to drive a corrected address to multiplexer 108 along with a control signal which causes multiplexer 108 to replace the uncorrected address with the corrected address. In this way, accesses to faulty memory locations are shunted to redundant memory locations. If more than N faulty locations are detected, counter 310 saturates, and a fatal error is indicated. A fatal error signal informs the user that the chip is not repairable and should be replaced.

In another implementation, the addresses stored and corrected by the BISR module 112 are column and/or row addresses, and separate counter, store, comparator, and selector elements are used for the column and row portions of the addresses. This allows faulty memory location replacement to occur on a column and/or row basis.

After BIST has completed, memory storage device 100 will commence normal operation. Requests to memory array 101 will be made on external address, read/write, and data signals, instead of the corresponding BIST-generated signals. In this case, the external address signal will be selected by address multiplexer 104 and conveyed upon the uncorrected address line to the BISR module 112 and correction multiplexer 108. If a match is found by the comparators 320 in BISR module 112, the address selector 340 in BISR module 112 will drive a corrected address and a multiplexer control signal to correction multiplexer 108. If a match is not found by the comparators 320, the uncorrected address is allowed to propagate through the correction multiplexer 108.

As described above, BIST unit 110 and BISR module 112 detect failing memory cells within memory array 101 at power-up time and at typical operating temperatures. Accesses to these addresses may then be rerouted to other locations, thereby allowing continued operation of memory storage device 100. If a particular location in memory array 101 fails subsequent to BIST being performed, however, it is not re-mapped by BISR module 112. Therefore, BIST and BISR alone may not detect some types of memory failures, especially those that are likely to occur after a period of time or under degraded operating conditions. Accesses to a row or column susceptible to such failures may thus result in potential data loss. The inclusion of a heating element 116 and a temperature sensor 118 minimize these risks by allowing for the approximation of normal operating conditions prior to the execution of the BIST and BISR.

Figure 5:
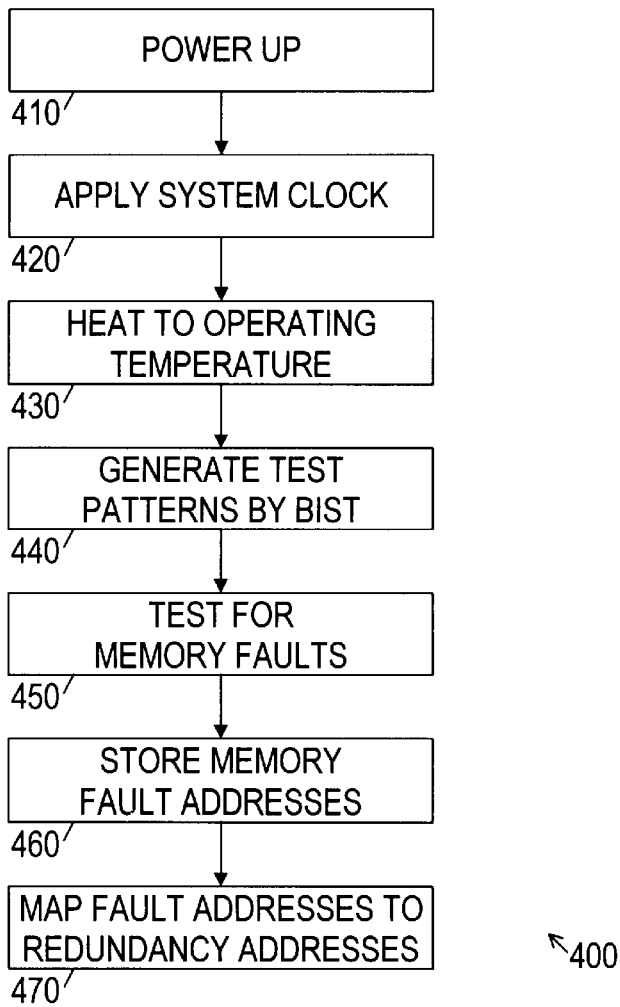
FIG. 5 depicts a flowchart of one embodiment of a method for testing a memory storage device.

Referring now to FIG. 5, a flowchart of a test method 400 for memory storage device 100 is shown. Diagnosis of the device 100 is performed every time power is supplied 410 to the system, which initiates the BIST and BISR units. On power up, application 420 of a system clock starts the internal repairing process. The heating element 116 is used to heat 430 the memory array 101 to a typical operating temperature. Detection of a desired operating temperature by temperature sensor 118 allows the BIST unit 110 to begin generating 440 test patterns which are coupled to the memory array 101 to test 450 for various types of memory faults, including column, row, bridging, stuck-at, and retention files. After the BIST unit 110 detects the faulty memory locations in memory array 101, the uncorrected addresses of the faulty memory locations are transferred to the BISR module 112 and stored 460 in the address stores 320. The uncorrected addresses of the faulty memory locations are then mapped 470 to the corrected address locations of the redundant memory locations.

In one implementation, a test suite performed at the manufacturing site includes the procedure described above, and further includes standard D.C. tests for continuity and leakage. The test suite may begin with a gross functional test conducted at both a high and low supply voltage. The gross functional test involves various read and write patterns with only a loose timing constraint (that is, the basic functionality of the device is under test, not necessarily its speed). Next, an "at-speed" test is performed. This is similar to the gross functional test, only it is performed at the rated speed of the device. Next a "voltage bump" test is conducted in which the device 100 is written at low voltage, read at high voltage, etc. Lastly, after the memory array has reached the desired operating temperature, a refresh test is conducted in which each memory cell is checked to verify its data retention properties. These tests may further be performed at an excess temperature or voltage to simulate worst-case conditions. Any failures which occur are monitored and stored, and if determined to be excessive, the part is deemed defective. If all locations pass, however, the part is considered operational.

Numerous variations and modifications will become apparent to those skilled in the art once the above disclosure is fully appreciated. It is intended that the following claims be interpreted to embrace all such variations and modifications.

What is claimed is:

1. A memory device which comprises:
   a memory array on a substrate, wherein the memory array is configured to a receive a read/write signal on a read/write line, configured to receive an address on an address bus, configured to provide data to a data bus when the read/write signal indicates a read operation, and configured to store data from the data bus when the read/write signal indicates a write operation, wherein the data on the data bus is stored in a memory location indicated by the address; and
   a heating element coupled to the substrate to heat the memory array to a predetermined operating temperature.

2. The memory device of claim 1, further comprising:
   a temperature sensor coupled to the substrate and configured to provide a temperature signal indicative of a temperature of the memory array; and
   a heating control coupled to receive the temperature signal and coupled to responsively provide power to the heating element.

3. The memory device of claim 2, wherein the heating control is configured to begin providing power to the heating element when the memory device is powered on, and wherein the heating control is configured to stop providing power to the heating element when the temperature signal is indicative of the predetermined operating temperature.

4. The memory device of claim 1, further comprising a BIST (built-in self test) unit coupled to provide the read/write signal on the read/write line, coupled to provide the address on the address line, and coupled to provide and receive data on the data bus, wherein the BIST unit is configured to generate test patterns and apply the test patterns to the memory array to test for faulty memory locations after the memory array has been heated to the predetermined operating temperature.

5. The memory unit of claim 4, further comprising a BISR (built-in self repair) module coupled to receive a detected faulty memory location from the BIST unit, and coupled to the address line to store the address of the detected faulty memory location, wherein the BISR module is configured to intercept subsequent accesses to the detected faulty memory location and reroute the accesses to a redundant memory location.

6. The memory unit of claim 4, further comprising:

a temperature sensor coupled to the substrate and configured to provide a temperature signal indicative of a temperature of the memory array; and a refresh interval lookup table coupled to receive the temperature signal and configured to responsively provide a refresh interval to the BIST unit.

7. A method for on-chip testing and repairing of memories in a system that contains a heating element, a test circuit, a repair circuit, a memory array, and a plurality of redundant memory locations within the memory array, the method comprising the steps of:

heating the memory array to a predetermined operating temperature;

testing the memory array;

determining an original address of a faulty location in the memory array; and repairing the faulty location by using the repair circuit to redirect the original address to an address of a redundant memory location.

8. The method of claim 7, wherein the heating step includes:

applying power to the heating element at system power-on;

sensing a temperature of the memory array with a temperature sensor; and discontinuing the power to the heating element when the temperature of the memory array approaches the predetermined operating temperature.

9. The method of claim 8, wherein said testing step includes:

obtaining a data retention test interval;

generating a test pattern;

applying the test pattern to the memory array; and comparing data from the memory array to expected results.

10. The method of claim 9, wherein the obtaining step includes:

receiving a temperature signal from the temperature sensor; and providing the temperature signal to a lookup table.

11. The method of claim 10, further comprising the steps, prior to the repairing step, of:

storing the original address; and translating the original address to the address of the redundant memory location.

12. An on-chip system for detecting and repairing data retention faults under normal operating conditions, wherein the system comprises:

a memory array including a plurality of memory cells;

a plurality of redundant memory cells coupled to the memory array for replacing faulty memory cells;

a heating element coupled to the memory array for heating the memory array to a predetermined operating temperature;

a testing unit coupled to the memory array for testing the memory array and determining an original address of a faulty memory cell; and a repair module coupled to the memory array and the testing unit for repairing the faulty memory cell with a redundant memory cell by redirecting the original address to an address of the redundant memory cell.

13. The system of claim 12, further comprising:

a temperature sensor coupled to the memory array, and configured to provide a temperature signal indicative of a temperature of the memory array; and a heating control configured to provide power to the heating element when the system is powered-on, and configured to discontinue powering the heating element when the temperature signal is indicative of the predetermined operating temperature.

14. The system of claim 13, further comprising a lookup table coupled to receive the temperature signal and configured to provide a refresh interval to the testing unit.

15. The system of claim 14, wherein the testing unit is configured to test the memory array to detect data retention faults after the memory array has been heated to the predetermined operating temperature.

16. An on-chip system for detecting and repairing data retention faults, wherein the system comprises:

a memory array including a plurality of memory cells;

a plurality of redundant memory cells coupled to the memory array for replacing faulty memory cells;

a heating element coupled to the memory array for heating the memory array;

a testing unit coupled to the memory array for testing the memory array and determining an original address of a faulty memory cell; and a repair module coupled to the memory array and the testing unit for repairing the faulty memory cell with a redundant memory cell by redirecting the original address to an address of the redundant memory cell.

17. The system of claim 16, further comprising a heating control configured to provide power to the heating element when the system is powered-on, and configured to discontinue powering the heating element after a predetermined time interval has elapsed.

18. The system of claim 17, wherein the testing unit is configured to test the memory array to detect data retention faults after the heating control has discontinued powering the heating element.

* * * * *